(12) United States Patent
Ahn et al.

(10) Patent No.: US 12,532,603 B2
(45) Date of Patent: Jan. 20, 2026

(54) ELECTROLUMINESCENCE DISPLAY

(71) Applicant: LG Display Co., Ltd., Seoul (KR)

(72) Inventors: JiYoung Ahn, Paju-si (KR); Yongjae Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 456 days.

(21) Appl. No.: 18/082,804

(22) Filed: Dec. 16, 2022

(65) Prior Publication Data

US 2023/0217699 A1 Jul. 6, 2023

(30) Foreign Application Priority Data

Dec. 30, 2021 (KR) ........................ 10-2021-0192840

(51) Int. Cl.
*H10K 50/86* (2023.01)
*H10K 50/826* (2023.01)
*H10K 59/126* (2023.01)
*H10K 59/131* (2023.01)

(52) U.S. Cl.
CPC ........... *H10K 50/86* (2023.02); *H10K 50/826* (2023.02); *H10K 59/131* (2023.02); *H10K 59/126* (2023.02)

(58) Field of Classification Search
CPC .... H10K 50/86; H10K 50/865; H10K 50/856; H10K 59/8791; H10K 59/8792; H10K 59/878; H10K 59/126
See application file for complete search history.

(56) References Cited

U.S. PATENT DOCUMENTS

| 9,093,660 | B2 | 7/2015 | Yang et al. |
| 2002/0180349 | A1 | 12/2002 | Aziz et al. |
| 2004/0256980 | A1* | 12/2004 | Tsuchiya ................ H10K 71/60 313/506 |
| 2012/0319151 | A1* | 12/2012 | Cho ..................... H10K 50/826 438/46 |

(Continued)

FOREIGN PATENT DOCUMENTS

| KR | 10-2014-0019990 A | 2/2014 |
| KR | 10-2015-0037278 A | 4/2015 |

(Continued)

OTHER PUBLICATIONS

Xie et al, "Reduced ambient reflection of organic light-emitting diodes by utilizing multilayer low-reflection cathodes", 2006, Semiconductor Science and Technology, 21, pp. 1077-1082 (Year: 2006).*

(Continued)

*Primary Examiner* — Bumsuk Won
(74) *Attorney, Agent, or Firm* — Fenwick & West LLP

(57) ABSTRACT

An electroluminescence display having enhanced display quality by preventing external light from being reflected is disclosed. An electroluminescence display according to the present disclosure comprises: a substrate including an emission area and a non-emission area; a partially transparent layer on the substrate; a transparent layer on the partially transparent layer; a signal line in the non-emission area on the transparent layer; a passivation layer covering the signal line; a planarization layer on the passivation layer; and a light emitting element including a first electrode, an emission layer and a second electrode in the emission area on the planarization layer.

16 Claims, 9 Drawing Sheets

(56) References Cited

U.S. PATENT DOCUMENTS

| | | | |
|---|---|---|---|
| 2014/0042396 A1* | 2/2014 | Yang | H10K 59/8792 |
| | | | 257/40 |
| 2014/0339521 A1 | 11/2014 | Ozawa | |
| 2015/0137093 A1 | 5/2015 | Yang et al. | |
| 2016/0248039 A1* | 8/2016 | Choung | H10K 50/828 |
| 2017/0279084 A1 | 9/2017 | Sakamoto et al. | |
| 2018/0061908 A1* | 3/2018 | Shim | H10K 59/1216 |
| 2018/0151655 A1 | 5/2018 | Kim et al. | |
| 2023/0189618 A1* | 6/2023 | Shi | H10K 59/8792 |
| | | | 382/118 |

FOREIGN PATENT DOCUMENTS

| | | |
|---|---|---|
| KR | 10-2016-0024061 A | 3/2016 |
| KR | 10-2016-0057526 A | 5/2016 |
| KR | 10-2237139 B1 | 4/2021 |

OTHER PUBLICATIONS

European Patent Office, Extended European Search Report and Opinion, EP Patent Application No. 22214232.5, May 15, 2023, 12 pages.
Korean Intellectual Property Office, Office Action, Korean Patent Application No. 10-2021-0192840, Sep. 29, 2025, 21 pages.

\* cited by examiner

ELECTROLUMINESCENCE DISPLAY

CROSS-REFERENCE TO RELATED APPLICATION

This application claims the benefit of the Republic of Korea Patent Application No. 10-2021-0192840 filed on Dec. 30, 2021, which is hereby incorporated by reference in its entirety.

BACKGROUND

Field of Technology

The present disclosure relates to an electroluminescence display having enhanced display quality by reducing reflection of external light. Especially, the present disclosure relates to a bottom emission type electroluminescence display including a structure for suppressing reflection of external light without a polarizer by applying a low reflection structure or element to an outer surface of the display substrate.

Discussion of the Related Art

Recently, various type of display such as the cathode ray tubes (CRTs), the liquid crystal displays (LCDs), the plasma display panels (PDPs) and the electroluminescent displays have been developed. These various types of display are used to display image data of various products such as computer, mobile phones, bank deposit and withdrawal devices (ATMs), and vehicle navigation systems according to their unique characteristics and purposes.

In the electroluminescence display that is a self-luminous display device with excellent display quality, an external light reflection suppressing structure can be accomplished by disposing a polarization element at outer surface of the display panel. The polarization element for suppressing external light reflection may have a problem of reducing the amount of light provided by the display device, and it is very expensive element. Therefore, there is a demand for the development of a structure for an electroluminescence display capable of suppressing external light reflection without adding a polarizing element.

SUMMARY

The purpose of the present disclosure, as for solving the problems described above, is to provide an electroluminescence display having a low reflection structure capable of reducing display quality deterioration due to the reflection of the external light by various lines and cathode electrode. Another purpose of the present disclosure is to provide an electroluminescence display having a structure for suppressing reflection of light incident on a display panel from the outside without using a polarizer element. Still another purpose of the present disclosure is to provide an electroluminescence display capable of providing image information from a display panel to a user by preventing external light from being reflected.

In order to accomplish the above mentioned purposes of the present disclosure, an electroluminescence display according to the present disclosure comprises: a substrate including an emission area and a non-emission area; a partially transparent layer on the substrate, the partially transparent layer having a first optical transmittance; a transparent layer on the partially transparent layer, the transparent layer having a second optical transmittance that is greater than the first optical transmittance of the partially transparent layer; a signal line on the transparent layer in the non-emission area; a passivation layer covering the signal line; a planarization layer on the passivation layer; and a light emitting element on the planarization layer in the emission area, the light emitting element including a first electrode, an emission layer on the first electrode, and a second electrode on the emission layer.

In one embodiment, a display device comprises: a substrate including an emission area and a non-emission area; a transistor in the non-emission area; a light emitting element in the emission area, the light emitting element electrically connected to the transistor; a first transparent layer on the substrate, the first transparent layer having a first optical transmittance; and a second transparent layer on the first transparent layer, the transparent layer having a second optical transmittance that is different from the first optical transmittance of the first transparent layer, wherein a thickness of the second transparent layer is proportional to a half wavelength of a predetermined color of light.

In one embodiment, a display device comprises: a substrate including an emission area and a non-emission area; a transistor in the non-emission area; a light emitting element in the emission area, the light emitting element electrically connected to the transistor; a metal layer that at least partially overlaps the transistor in the non-emission area; and a plurality of transparent layers including a first transparent layer and a second transparent layer that is more transparent than the first transparent layer, the plurality of transparent layers overlapping the transistor and are between the metal layer and the substrate in the non-emission area, wherein the first transparent layer is configured to reflect a portion of incident light having a first phase and transmit a portion of the incident light toward the transistor, and the second transparent layer is configured to transmit the portion of the incident light from the first transparent layer toward the transistor such that the portion of incident light is reflected by the metal layer and has a second phase that is opposite in phase to the first phase.

The electroluminescent display according to the present disclosure may include a low reflective structure on the inner surface of the substrate at the viewing direction of the viewer, and has a low reflectance of 5% or less to the incident light. Therefore, there is no problem in which image information provided from the display may not be properly recognized due to external light reflection. Without a relatively expensive polarizer element as used in the related art for suppressing external light reflection, the external light reflection may be lowered to a level comparable to or superior to that of the related art. Accordingly, the present disclosure may provide an electroluminescence display with reduced manufacturing cost and excellent image quality.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
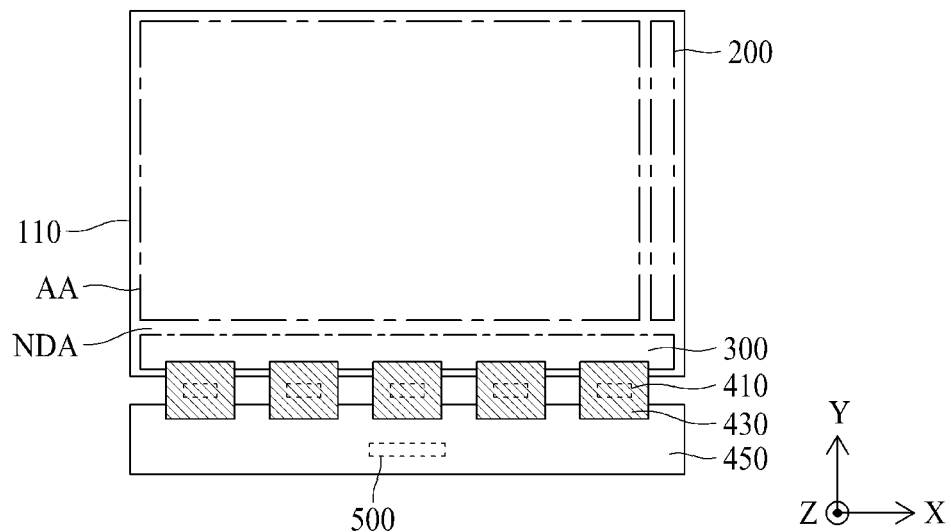
FIG. 1 is a plane view illustrating a schematic structure of an electroluminescence display according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified. In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween. Also, if a first element is described as positioned "on" a second element, it does not necessarily mean that the first element is positioned above the second element in the figure.

The upper part and the lower part of an object concerned may be changed depending on the orientation of the object. Consequently, where a first element is described as positioned "on" a second element, the first element may be positioned "below" the second element or "above" the second element in the figure or in an actual configuration, depending on the orientation of the object.

In describing a temporal relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

In describing various elements in the present disclosure, terms such as first, second, A, B, (a), and (b) may be used. These terms are used merely to distinguish one element from another, and not to define a particular nature, order, sequence, or number of the elements. Where an element is described as being "linked", "coupled," or "connected" to another element, that element may be directly or indirectly connected to that other element unless otherwise specified. It is to be understood that additional element or elements may be "interposed" between the two elements that are described as "linked," "connected," or "coupled" to each other.

It should be understood that the term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Hereinafter, an example of a display apparatus according to the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the scale shown in the drawings.

Hereinafter, referring to the attached figures, the present disclosure will be explained. FIG. 1 is a plane view illustrating a schematic structure of an electroluminescence display according to one embodiment of the present disclosure. In FIG. 1, X-axis refers to the direction parallel to the scan line, Y-axis refers to the direction of the data line, and Z-axis refers to the height direction of the display device.

Referring to FIG. 1, the electroluminescence display comprises a substrate 110, a gate (or scan) driver 200, a data pad portion 300, a source driving IC (Integrated Circuit) 410, a flexible film 430, a circuit board 450, and a timing controller 500.

The substrate 110 may include an electrical insulating material or a flexible material. The substrate 110 may be made of a glass, a metal or a plastic, but it is not limited thereto. When the electroluminescence display is a flexible display, the substrate 110 may be made of the flexible material such as plastic. For example, the substrate 110 may include a transparent polyimide material.

The substrate 110 may include a display area AA and a non-display area NDA. The display area AA, which is an area for displaying the video images, may be defined as the majority middle area of the substrate 110, but it is not limited thereto. In the display area AA, a plurality of scan lines (or gate lines), a plurality of data lines, and a plurality of pixels may be formed or disposed. Each of pixels may include a plurality of sub pixels. Each of sub pixels includes the scan line and the data line, respectively.

The non-display area NDA, which is an area that does not display the video images, may be disposed adjacent to the display area AA. For example, the non-display area NDA may be defined at the circumference areas of the substrate 110 surrounding all or some of the display area AA. In the non-display area NDA, the gate driver 210 and the data pad portion 300 may be formed or disposed.

The gate driver 210 may supply the scan (or gate) signals to the scan lines according to the gate control signal received from the timing controller 500. The gate driver 210 may be formed at the non-display area NDA at any one outside of the display area AA on the substrate 110, as a GIP (Gate driver In Panel) type. GIP type means that the gate driver 210 is directly formed on the substrate 110.

The data pad portion 300 may supply the data signals to the data line according to the data control signal received from the timing controller 500. The data pad portion 300 may be made as a driver chip and mounted on the flexible film 430. Further, the flexible film 430 may be attached at the non-display area NDA at any one outside of the display area AA on the substrate 110, as a TAB (Tape Automated Bonding) type.

The source driving IC 410 may receive the digital video data and the source control signal from the timing controller 500. The source driving IC 410 may convert the digital video data into the analog data voltages according to the source control signal and then supply that to the data lines. When the source driving IC 410 is made as a chip type, it may be installed on the flexible film 430 as a COF (chip on film) or COP (chip on plastic) type.

The flexible film 430 may include a plurality of first link lines connecting the data pad portion 300 to the source driving IC 410, and a plurality of second link lines connecting the data pad portion 300 to the circuit board 450. The flexible film 430 may be attached on the data pad portion 300 using an anisotropic conducting film, so that the data pad portion 300 may be connected to the first link lines of the flexible film 430.

The circuit board 450 may be attached to the flexible film 430. The circuit board 450 may include a plurality of circuits implemented as the driving chips. For example, the circuit board 450 may be a printed circuit board or a flexible printed circuit board.

The timing controller 500 may receive the digital video data and the timing signal from an external system board through the line cables of the circuit board 450. The timing controller 500 may generate a gate control signal for controlling the operation timing of the gate driver 210 and a source control signal for controlling the source driving IC 410, based on the timing signal. The timing controller 500 may supply the gate control signal to the gate driver 210 and supply the source control signal to the source driving IC 410. Depending on the product types, the timing controller 500 may be formed as one chip with the source driving IC 410 and mounted on the substrate 110.

First Embodiment

Figure 2:
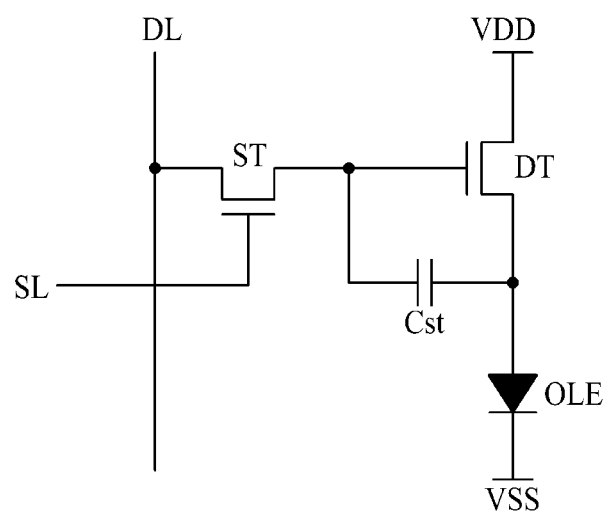
FIG. 2 is a circuit diagram illustrating a structure of one pixel included in the electroluminescence display according to one embodiment of the present disclosure.
Figure 3:
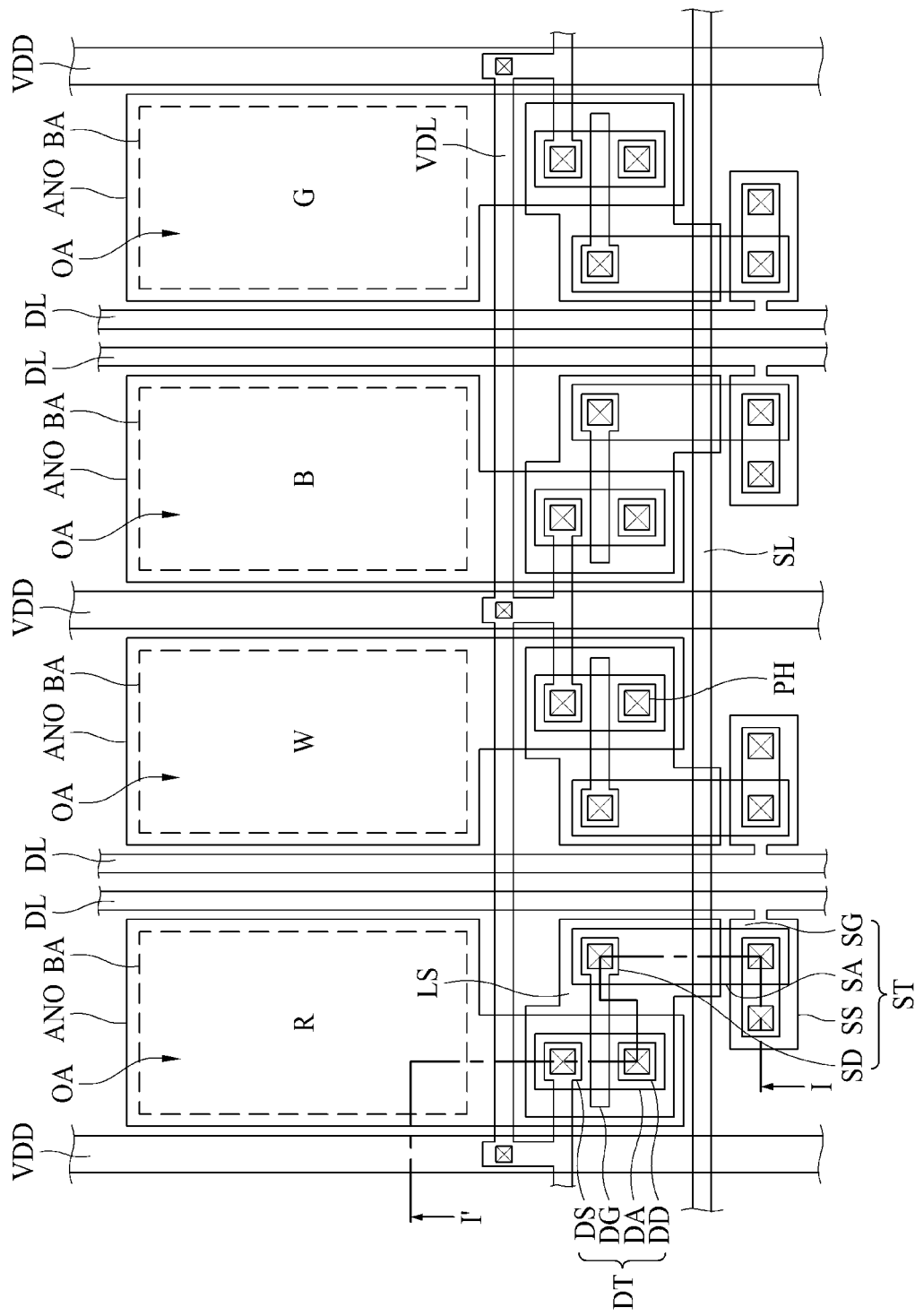
FIG. 3 is a plan view illustrating a structure of the pixels disposed in the electroluminescence display according to one embodiment of the present disclosure.
Figure 4:
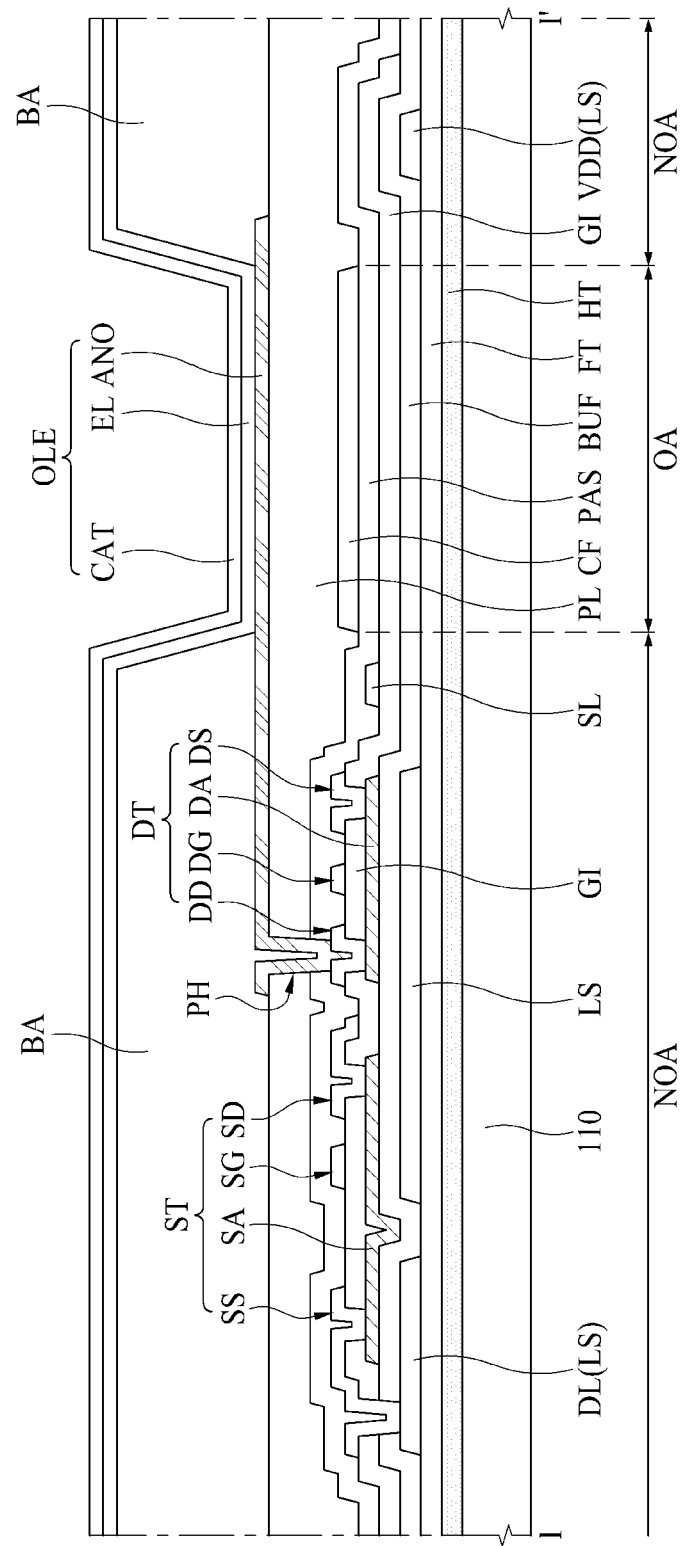
FIG. 4 is a cross-sectional view along cutting line I-I' in FIG. 3 that illustrates the low reflecting structure of the electroluminescence display according to a first embodiment of the present disclosure.

Hereinafter, referring to FIGS. 2 to 4, a first embodiment of the present disclosure will be explained. FIG. 2 is a circuit diagram illustrating a structure of one pixel according to one embodiment of the present disclosure. FIG. 3 is a plan view illustrating a structure of the pixels according to one embodiment of the present disclosure. FIG. 4 is a cross-sectional view along cutting line I-I' in FIG. 3 that illustrates the low reflecting structure of the electroluminescent display according to a first embodiment of the present disclosure.

Referring to FIGS. 2 to 4, one pixel of the light emitting display may be defined by a scan line SL, a data line DL and a driving current line VDD. One pixel of the light emitting display may include a switching thin film transistor ST, a driving thin film transistor DT, a light emitting diode OLE and a storage capacitance Cst. The driving current line VDD may be supplied with a high-level voltage for driving the light emitting diode OLE.

A switching thin film transistor ST and a driving thin film transistor DT may be formed on a substrate 110. For example, the switching thin film transistor ST may be disposed at the portion where the scan line SL and the data line DL is crossing. The switching thin film transistor ST may include a switching gate electrode SG, a switching source electrode SS and a switching drain electrode SD. The switching gate electrode SG may be connected to the scan line SL. The switching source electrode SS may be connected to the data line DL and the switching drain electrode SD may be connected to the driving thin film transistor DT. By supplying the data signal to the driving thin film transistor DT, the switching thin film transistor ST may play a role of selecting a pixel which would be driven.

The driving thin film transistor DT may play a role of driving the light emitting diode OLE of the selected pixel by the switching thin film transistor ST. The driving thin film transistor DT may include a driving gate electrode DG, a driving source electrode DS and a driving drain electrode DD. The driving gate electrode DG may be connected to the switching drain electrode SD of the switching thin film transistor ST. For example, the driving gate electrode DG may be extended from the switching drain electrode SD on the gate insulating layer GI. The driving source electrode DS may be connected to the driving current line VDD, and the driving drain electrode DD may be connected to an anode electrode ANO of the light emitting diode OLE. A storage capacitance Cst may be disposed between the driving gate electrode DG of the driving thin film transistor DT and the anode electrode ANO of the light emitting diode OLE.

The driving thin film transistor DT may be disposed between the driving current line VDD and the light emitting diode OLE. The driving thin film transistor DT may control the amount of electric current flowing to the light emitting diode OLE from the driving current line VDD according to the voltage level of the driving gate electrode DG connected to the switching drain electrode SD of the switching thin film transistor ST.

The light emitting diode OLE may include an anode electrode ANO, an emission layer EL and a cathode electrode CAT. The light emitting diode OLE may emit the light according to the amount of the electric current controlled by the driving thin film transistor DT. In other words, the light emitting diode OLE may be driven by the voltage differences between the low-level voltage and the high-level voltage controlled by the driving thin film transistor DT. The anode electrode ANO of the light emitting diode OLE may be connected to the driving drain electrode DD of the driving thin film transistor DT, and the cathode electrode CAT may be connected to a low-level voltage line VSS where a low-level potential voltage is supplied. That is, the light emitting diode OLE may be driven by the high-level voltage controlled by the driving thin film transistor DT and the low-level voltage supplied from the low-level voltage line VSS.

FIG. 3 is an enlarged plan view illustrating a portion of the display area AA providing image information. In FIG. 3, the dotted line indicates the boundary of the bank BA. The bank BA is disposed between two adjacent anode electrodes ANO while exposing most of the central area of each anode electrode ANO and covering the edge regions of each anode electrode ANO. At the anode electrode ANO disposed in the display area AA, the exposed portion by the bank BA may be defined as the emission area OA. In the display area AA, the covered portion by the bank BA may be defined as the non-emission area NOA.

Referring to FIG. 4, the cross-sectional structure of the electroluminescence display according to the first embodiment of the present disclosure will be described. A half-transparent layer HT (e.g., a partially transparent layer) covering the entire surface of the substrate 110 is deposited on the substrate 110. A transparent layer FT covering the entire surface of the substrate 110 is deposited on the half transparent layer HT. In one embodiment, the half transparent layer HT has an optical transmittance that allows for transmission of external light that is incident on the electroluminescence display and reflection of external light that is incident on the electroluminescence display. In one embodiment, the half transparent layer HT may have the optical properties of transmitting a portion (e.g., a range of 40% to 50% amount or 50% amount) of the light incident from the outside of the substrate 110 and of reflecting a remaining portion (e.g., a range of 60% to 50% amount, or 50% amount) of the light. For example, the half transparent layer HT may be formed of a metal material having a thickness in range of 100 Å to 200 Å. The half transparent layer HT may be made of any one material selected from aluminum (Al), silver (Ag), molybdenum (Mo), gold (Au), magnesium (Mg), calcium (Ca), titanium (Ti), copper (Cu) or barium (Ba) or two or more alloy materials thereof.

In contrast, the transparent layer FT has optical properties that allow for transmission of external light that is incident on the electroluminescence display. In one embodiment, the transparent layer FT may be formed of a transparent inorganic material having optical transmittance of 98% or more. In addition, the transparent layer FT may be formed of an inorganic material having a thickness in range of 200 Å to 1,200 Å. For example, the transparent layer FT may be formed of silicon oxide (SiOx), silicon nitride (SiNx) or silicon nitride oxide (SiON). Generally, the transparent layer FT allows for more transmission of incident light compared to the half transparent layer HT while the half transparent layer HT reflects more incident light than the transparent layer FT.

The light shielding layer LS (e.g., a metal layer) may be disposed on the transparent layer FT. The light shielding layer LS may include a light shielding region and a signal line region. The signal line region of the light shielding layer LS may include the data line DL (e.g., a metal layer) and the driving current line VDD. Further, the light shielding region of the light shielding layer LS may be disposed as being apart from the data line DL and the driving current line VDD with a predetermined distance, and having an island shape overlapping with the switching semiconductor layer SA of the switching thin film transistor ST and the driving semiconductor layer DA of the driving thin film transistor DT. The light shielding layer LS is not used for any conductive line and may block the external light from intruding into the semiconductor layer SA and DA to reduce deterioration of the characteristics of the semiconductor layers SA and DA. In one embodiment, the light shielding layer LS may be disposed as being overlapped with the channel regions in the semiconductor layers SA and DA which are overlapped with the gate electrodes SG and DG, respectively. In addition, the light shielding layer LS may be disposed as being overlapped with some portions of the source-drain electrodes SS, SD, DS and DD respectively contacting to the semiconductor layers SA and DA.

On the light shielding layer LS, a buffer layer BUF is disposed as covering the whole surface of the substrate 110. On the buffer layer BUF, the switching semiconductor layer SA and the driving semiconductor layer DA are formed. It is preferable that the channel areas in the semiconductor layers SA and DA are disposed as overlapping with the light shielding layer LS.

A gate insulating layer GI may be disposed on the surface of the substrate 110 having the semiconductor layers SA and DA. On the gate insulating layer GI, a switching gate electrode SG may be formed as being overlapped with the switching semiconductor layer SA and a driving gate electrode DG may be formed as being overlapped with the driving semiconductor layer DA. At both sides of the switching gate electrode SG, a switching source electrode SS contacting with a first side of the switching semiconductor layer SA and being apart from the switching gate electrode SG may be formed, and a switching drain electrode SD contacting with a second side of the switching semiconductor layer SA and being apart from the switching gate electrode SG may be formed. In addition, at both sides of the driving gate electrode DG, a driving source electrode DS contacting with a first side of the driving semiconductor layer DA and being apart from the driving gate electrode DG may be formed, and a driving drain electrode DD contacting with a second side of the driving semiconductor layer DA and being apart from the driving gate electrode DG may be formed.

The gate electrodes SG and DG and the source-drain electrodes SS, SD, DS and DD are formed at the same layer, but they are separated each other. The switching source electrode SS may be connected to the data line DL formed as a part of the signal line region of the light shielding layer LS via a contact hole penetrating the gate insulating layer GI and the buffer layer BUF. In addition, the driving source electrode DS may be connected to the driving current line VDD formed as another part of the signal region of the light shielding layer LS via another contact hole penetrating the gate insulating layer GI and the buffer layer BUF.

On the substrate 110 having the thin film transistors ST and DT, a passivation layer PAS may be deposited. The passivation layer PAS may be formed of inorganic layer such as silicon oxide or silicon nitride. A color filter CF may be formed on the passivation layer PAS.

The color filter CF may be an element for representing color allocated at each pixel. For an example, one color filter CF may have a size and a shape corresponding to the size and the shape of one pixel. For another example, one color filter CF may have a size slightly larger than that of the light emitting diode OLE which will be formed later and may be disposed to overlap the light emitting diode OLE.

A planarization layer PL may be deposited on the color filter CF. The planarization layer PL may be a thin film for flattening or evening the non-uniform surface of the substrate 110 on which the thin film transistors ST and DT are formed. To do so, the planarization layer PL may be made of the organic materials. The passivation layer PAS and the planarization layer PL may have a pixel contact hole PH for exposing some portions of the drain electrode DD of the driving thin film transistor DT.

On the surface of the planarization layer PL, an anode electrode ANO may be formed. The anode electrode ANO may be connected to the drain electrode DD of the driving thin film transistor DT via the pixel contact hole PH. The anode electrode ANO may have different elements according to the emission condition of the light emitting diode OLE. For the bottom emission type in which the emitted light may be provided to the substrate 110, the anode electrode ANO may be made of a transparent conductive material. For the top emission type in which the emitted light may be provided to the direction opposing the substrate 110, the anode electrode ANO may include a metal material with excellent reflection ratio.

In the case of a large area display device such as a TV set, the cathode electrode CAT disposed on the anode electrode ANO may be formed as one layer as covering a large area. The cathode electrode CAT maintains a uniform low voltage over a wide area. Therefore, in the case of a large-area display device, the cathode electrode CAT may be formed of an opaque metal material in order to maintain a low sheet resistance. Therefore, in the case of a large-area display device, the bottom emission type structure is used. For the bottom emission type, the anode electrode ANO may be made of a transparent conductive material. For example, the anode electrode ANO may include oxide conductive materials such as indium-zin-oxide (IZO) or indium-tin-oxide (ITO).

On the anode electrode ANO, a bank BA may be formed. The bank BA may define an emission area by covering the circumference area of the anode electrode ANO and exposing most middle areas of the anode electrode ANO.

An emission layer EL may be deposited on the anode electrode ANO and the bank BA. The emission layer EL may be deposited over the whole surface of the display area AA on the substrate 110, as covering the anode electrodes ANO and banks BA. For an example, the emission layer EL may include two or more stacked emission portions for emitting white light. In detail, the emission layer EL may include a first emission layer providing first color light and a second emission layer providing second color light, for emitting the white light by combining the first color light and the second color light.

For another example, the emission layer EL may include at least any one of blue-light emission layer, green-light emission layer and red-light emission layer as corresponding to the color allocated to the pixel. In addition, the light emitting diode OLE may further include at least one functional layer for enhancing the light emitting efficiency and/or the service lifetime of the emission layer EL.

The cathode electrode CAT may be disposed on the emission layer EL. The cathode electrode CAT may be stacked on the emission layer EL as being surface contact each other. The cathode electrode CAT may be formed as one sheet element over the whole area of the substrate 110 as being commonly connected to whole emission layers EL disposed at all pixels. In the case of the bottom emission type, the cathode electrode CAT may include metal material having excellent light reflection ratio. For example, the cathode electrode CAT may include at least any one of aluminum (Al), silver (Ag), molybdenum (Mo), gold (Au), magnesium (Mg), calcium (Ca), titanium (Ti), copper (Cu), or barium (Ba).

Figure 5:
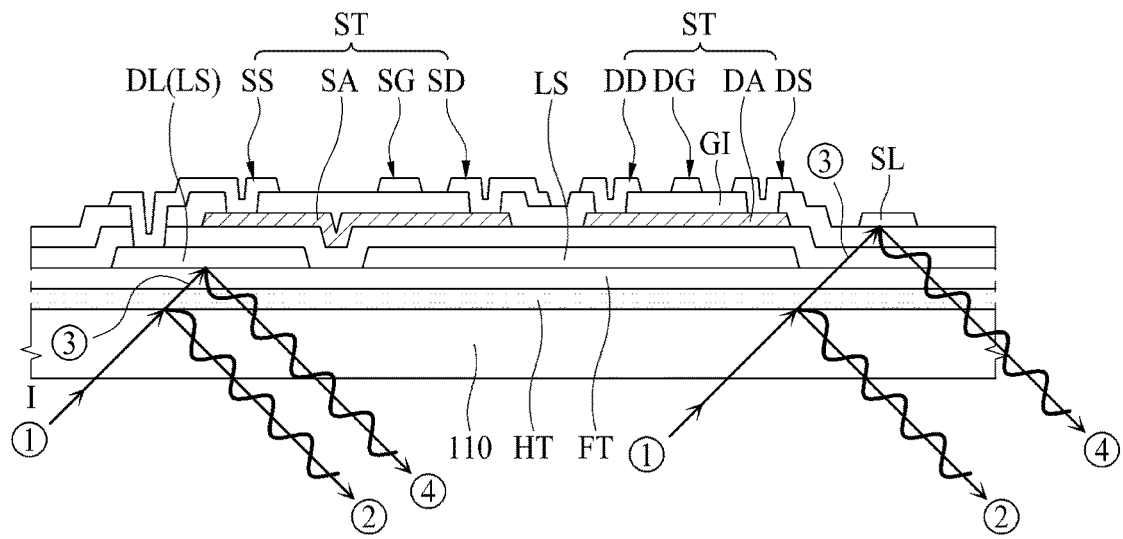
FIG. 5 is an enlarged cross-sectional view explaining the mechanism for reducing the reflection of external light at the non-emission area in FIG. 4 according to the first embodiment of the present disclosure.
Figure 6:
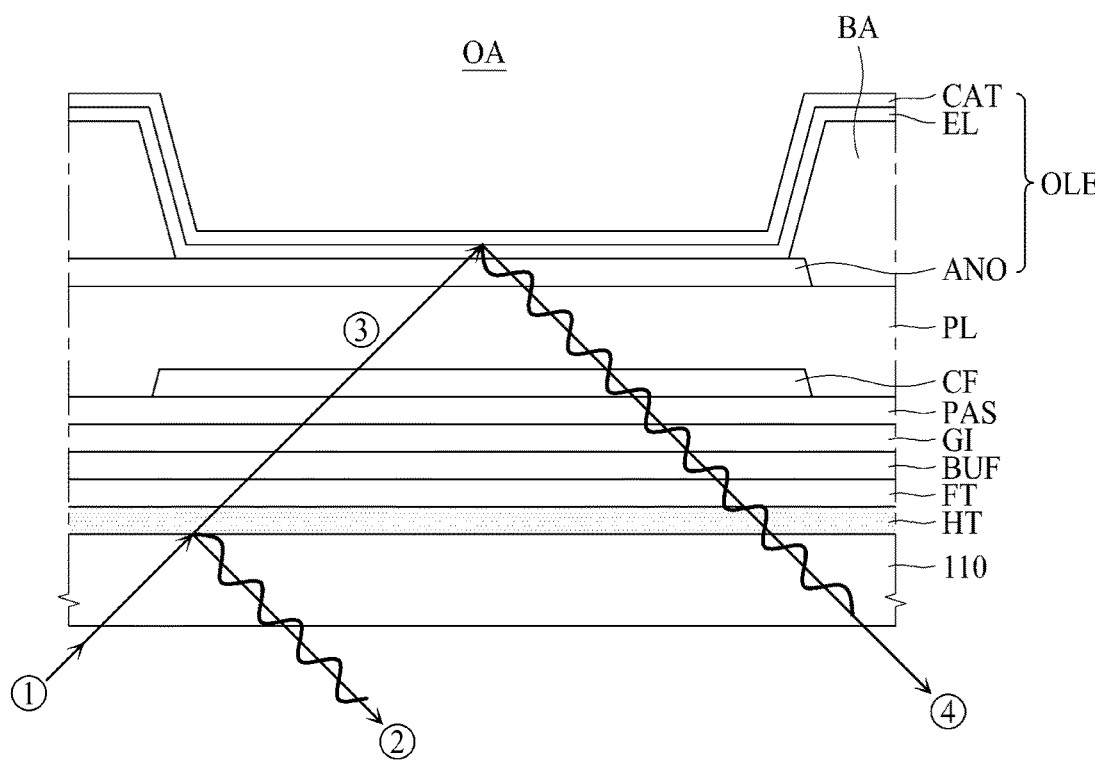
FIG. 6 is an enlarged cross-sectional view illustrating the mechanism for reducing the reflection of external light at the emission area in FIG. 4 according to the first embodiment of the present disclosure.

The present disclosure provides a low-reflection structure for reducing reflection of external light by the metal materials of the display device. For an example, a low reflection structure may be acquired by a stacked structure of a half transparent layer HT and a transparent layer FT deposited on the substrate 110. Hereinafter, referring to FIGS. 5 and 6, an optical mechanism for suppressing external light reflection will be described. FIG. 5 is an enlarged cross-sectional view explaining the mechanism for reducing the reflection of external light at the non-emission area in FIG. 4. FIG. 6 is an enlarged cross-sectional view illustrating the mechanism for reducing the reflection of external light at the emission area in FIG. 4.

Firstly, referring to FIG. 5, in the case that the half transparent layer HT is made of aluminum, to the half transparent layer HT has a thickness selected in range of 100 Å to 200 Å. Metallic materials such as aluminum are opaque and highly reflective. However, when aluminum is formed very thinly, light may be transmitted. For example, with an aluminum layer having a thickness selected in range of 100 Å to 200 Å, some portions (40%~50%) of incident light may be reflected and the remaining portions (50%~60%) may be transmitted. Hereinafter, for convenience of description, the half transparent layer HT optically has a transmittance of 50% and an absorption rate of 0%.

Incident light ① entering from the lower outside of the substrate 110 is transmitted through the substrate 110. 50% of the incident light ① is reflected from the lower surface of the half transparent layer HT to the substrate 110 as a first reflected light ②. Meanwhile, remaining 50% of the incident light ① passes through the half transparent layer HT. Almost all of the transmitting light ③ passing through the half transparent layer HT passes through the transparent layer FT having an optical transparency of 98% or more. Here, since the absorption rate of the transparent layer FT is not considered, 100% of the transmitted light ③ may be transmitted. Then, the transmitted light ③ is reflected by the light shielding layer LS. The light shielding layer LS may be used as the data line DL and the driving current line VDD. Accordingly, the light shielding layer LS may have a thickness of 2,000 Å to 4,000 Å, and all of the transmitted light ③ is reflected and propagated toward the substrate 110 as the second reflected light ④.

By adjusting or controlling the thickness of the transparent layer FT, the phases of the first reflected light ② and the second reflected light ④ may be set to cancel each other. For example, when it is desired to selectively lower the reflectance of green light, to which the human eye responds most sensitively, the thickness of the transparent layer FT may be set so that the distance between the bottom surface of the half transparent layer HT and the bottom surface of the light shielding layer LS is proportional to a multiple of a half wavelength of green light. For example, when the representative wavelength of green light is 550 nm, the distance between the bottom surface of the half transparent layer HT and the bottom surface of the light shielding layer LS may be formed to have a thickness of any one of 275 Å, 550 Å, 825 Å or 1,100 Å which is one of multiples of 275 nm, which is a half wavelength of green light. That is, the transparent layer FT may be formed of an inorganic material having a thickness selected in range of 200 Å to 1,500 Å.

The amount of the first reflected light ② may be 50% of the incident light ①, and the amount of the second reflected light ④ may also be 50% of the incident light ①. Therefore, in the optical view point of the first reflected light ② and the second reflected light ④, the amplitude is the same, but the phases are opposite, so they may be canceled by each other. As a result, reflected light luminance, which is the intensity of reflected light incident from the lower outside of the substrate 110 and reflected from the light shielding layer LS, may be reduced to a level of 2%.

Meanwhile, in the non-emission area NOA, a gate line SL may be disposed further to the light shielding layer LS. At the gate line SL, reflection of external light may be suppressed by the same mechanism as described above. Here, by adjusting the thicknesses of the buffer layer BUF and the gate insulating layer GI with the thickness of the transparent layer FT, the distance between the bottom surface of the half transparent layer HT and the bottom surface of the gate line SL may be formed to have a thickness of any one of 550 Å, 825 Å, 1,100 Å, 1,375 Å or 1,650 Å which are different multiples of 275 nm, which is a half wavelength of green light.

Briefly, as illustrated in the figure showing the light path shown on the right of FIG. 5, the first reflected light ② by the transparent layer FT may be 50% amount of the incident light ①, and the second reflected light ④ by the gate line SL may be 50% amount of the incident light ①. Further, the phases of the reflected light are opposite to each other. As a result, reflected light luminance, which is the intensity of reflected light incident from the lower outside of the substrate 110 and reflected from the gate line SL, may be reduced to a level of 2%.

Next, referring to FIG. 6, the mechanism for suppressing the external light reflection in the emission area OA of the electroluminescence display according to the first embodiment will be described.

Incident light ① entering from the lower outside of the substrate 110 is transmitted through the substrate 110. 50% of the incident light ① is reflected from the lower surface of the half transparent layer HT to the substrate 110 as a first reflected light ②. Meanwhile, remaining 50% of the incident light ① passes through the half transparent layer HT. Almost all of the transmitting light ③ passing through the half transparent layer HT sequentially passes through the transparent layer FT, the buffer layer BUF, the gate insulating layer GI and the passivation layer PAS having the optical transparency of 98% or more. Here, since the absorption rates of the transparent layer FT, the buffer layer BUF, the gate insulating layer GI and the passivation layer PAS are not considered, 100% of the transmitting light ③ may be transmitted.

After that, the transmitting light ③ passes through the color filter CF, then only light with a wavelength corresponding to the color allocated to each pixel is transmitted. At this time, the amount of light may be reduced by the color filter CF, but this is not considered here in convenience. The transmitting light ③ passing through the color filter CF may pass through the anode electrode ANO and the emission layer EL. Similarly, light loss due to the anode electrode ANO and the emission layer EL is not considered for convenience of description. Finally, the transmitting light ③ may be reflected by the cathode electrode CAT. The cathode electrode CAT may have a thickness selected in range of 2,000 Å to 4,000 Å, and all of the transmitting light ③ may be reflected and proceeds toward the substrate 110 as the second reflected light ④.

By adjusting or controlling the thickness of planarization layer PL and/or passivation layer PAS with the transparent layer FT, the phases of the first reflected light ② and the second reflected light ④ may be set to cancel each other. For example, the distance between the bottom surface of the half transparent layer HT and the bottom surface of the cathode electrode CAT may be formed to have a thickness of any one of 825 Å, 1,100 Å, 1,375 Å, 1,650 Å or 1,925 Å which are different multiples of 275 nm, which is a half wavelength of green light. The amount of the first reflected light ② may be 50% of the incident light ①, and the amount of the second reflected light ④ may also be 50% of the incident light ①. Therefore, in the optical view point of the first reflected light ② and the second reflected light ④, the amplitude is the same, but the phases are opposite, so they may be canceled each other.

Although the amount of transmitting light ③ is significantly reduced by the color filter CF, it does not absolutely affect the degree of total external light reflection. Even in consideration of the light amount of the second reflected light ④ produced by the reflected light ③ of which the amount of light has been reduced by the color filter CF, the luminance of the reflected light from the cathode electrode CAT may be reduced to a level of 10% or less. Since this level is the reflectance of external light in the emission area OA, when the average ratio of the area occupied by the emission area OA to the total area of the substrate 110, 40%, is taken into consideration, the reflectance of external light in the entire substrate 110 may be 5% or less.

Second Embodiment

Figure 7:
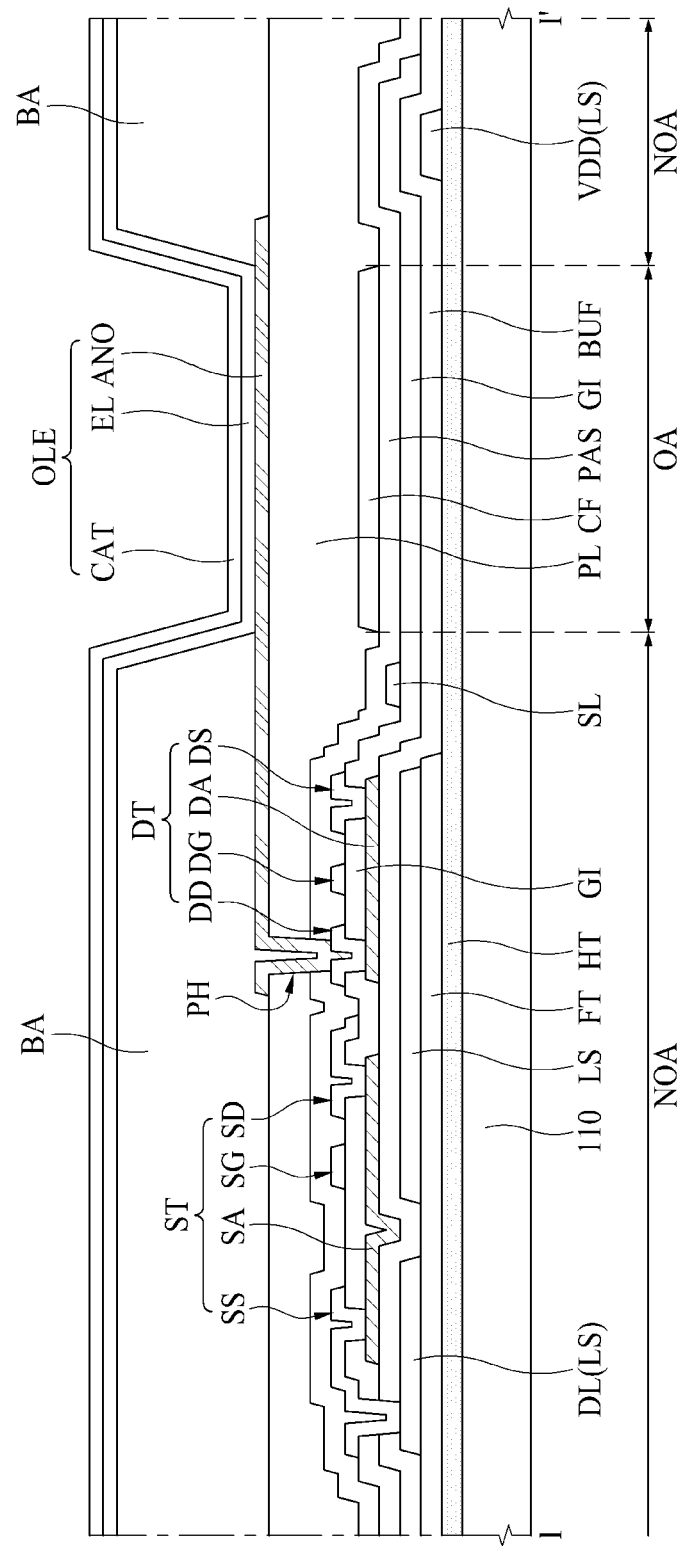
FIG. 7 is a cross-sectional view along cutting line I-I' in FIG. 3 to illustrate the low reflecting structure of the electroluminescence display according to a second embodiment of the present disclosure.
Figure 8:
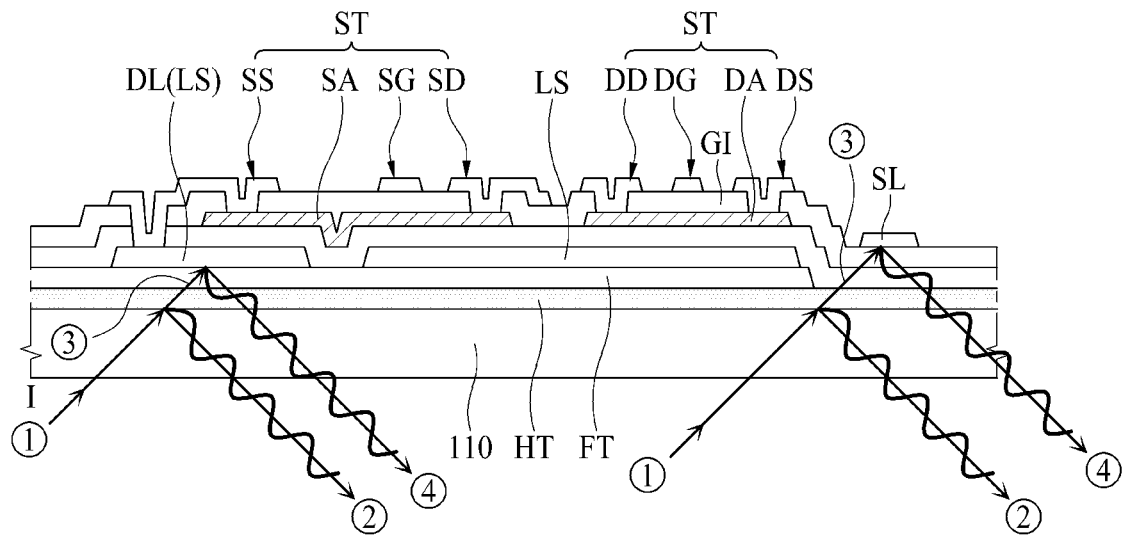
FIG. 8 is an enlarged cross-sectional view illustrating the mechanism for reducing the reflection of external light at the non-emission area in FIG. 7 according to th second embodiment of the present disclosure.
Figure 9:
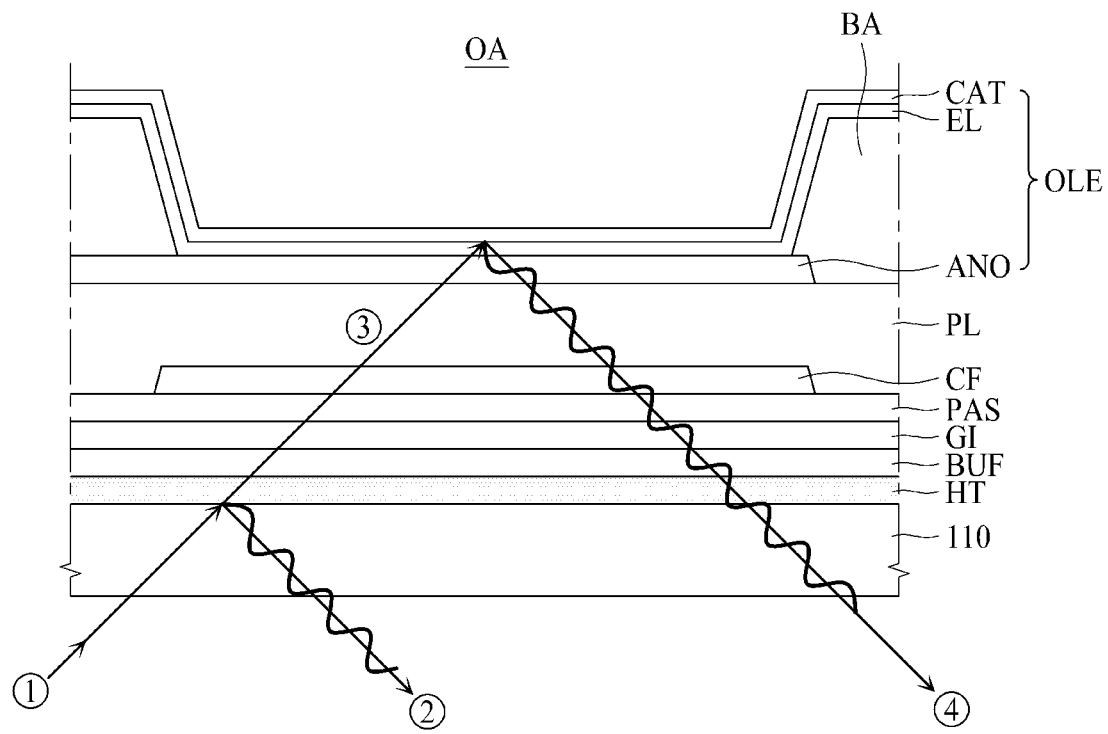
FIG. 9 is an enlarged cross-sectional view illustrating the mechanism for reducing the reflection of external light at the emission area in FIG. 7 according to th second embodiment of the present disclosure.

Hereinafter, referring to FIGS. 7 to 9, the second embodiment of the present disclosure will be described. FIG. 7 is a cross-sectional view along cutting line I-I' in FIG. 3 that illustrates the low reflecting structure of the electroluminescence display according to a second embodiment of the present disclosure. FIG. 8 is an enlarged cross-sectional view illustrating the mechanism for reducing the reflection of external light at the non-emission area in FIG. 7. FIG. 9 is an enlarged cross-sectional view illustrating the mechanism for lowering the reflection of external light at the emission area in FIG. 7.

Referring to FIG. 7, the features of the electroluminescence display according to the second embodiment is very similar with that of the first embodiment. The difference is that, in the first embodiment, the transparent layer FT is deposited on the entire surface of the substrate 110. In contrast, in the second embodiment, the transparent layer FT is selectively deposited at an area overlapping an area where the light shielding layer LS is disposed. Therefore, the description for the element of the second embodiment same with the first embodiment may not be duplicated. For the description of the reference numerals in FIG. 7 which is not mentioned in followings, refer to the description of the reference numerals shown in FIG. 4.

Referring to FIG. 8, the external light reflection suppression structure will be mainly described. Firstly, in the structure for suppressing external light reflection in the non-emission area NOA, reflection of external light reflected from the light shielding layer LS may be suppressed by the same manner as the mechanism described with reference to FIG. 5. That is, the first reflected light ② and the second reflected light ④ have the same amplitude and opposite phase, thus they may be canceled each other. As a result, reflected light luminance, which is the intensity of reflected light incident from the lower outside of the substrate 110 and reflected from the light shielding layer LS, may be reduced to a level of 2%.

Next, the structure for suppressing external light reflection in the portion of the gate line SL illustrated on the right side of FIG. 8 is as follows.

Incident light ① entering from the lower outside of the substrate 110 is transmitted through the substrate 110. 50% of the incident light ① is reflected from the lower surface of the half transparent layer HT to the substrate 110 as a first reflected light ②. Meanwhile, remained 50% of the incident light ① passes through the half transparent layer HT. Almost all of the transmitting light ③ passing through the half transparent layer HT passes through the buffer layer BUF and the gate insulating layer GI having the optical transparency of 98% or more. After that, the transmitting light ③ is reflected by the gate line SL. The gate line SL may have a thickness selected in range of 2,000 Å to 4,000 Å, and all of the transmitting light ③ is reflected and travels toward the substrate 110 as the second reflected light ④.

In this structure, the transparent layer FT is not disposed below the gate line SL. In this case, the absence of the transparent layer FT is the case in which the phases of the first reflected light ② and the second reflected light ④ may be set to be opposite from each other. Further, the amount of the first reflected light ② may be 50% of the incident light ①, and the amount of the second reflected light ④ may also be 50% of the incident light ①. Therefore, in the optical view point of the first reflected light ② and the second reflected light ④, the amplitude is the same, but the phases are opposite, so they may be canceled each other. As a result, reflected light luminance, which is the intensity of reflected light incident from the lower outside of the substrate 110 and reflected from the light shielding layer LS, may be reduced to a level of 2%.

Next, an external light reflection suppression mechanism in the emission area OA of the electroluminescence display according to the second embodiment will be described with reference to FIG. 9. The structure of the emission area OA according to the second embodiment is substantially similar to that of the first embodiment. The difference is that the transparent layer FT is not included in the second embodiment.

Incident light ① entering from the lower outside of the substrate 110 is transmitted through the substrate 110. 50% of the incident light ① is reflected from the lower surface of the half transparent layer HT to the substrate 110 as a first reflected light ②. Meanwhile, remaining 50% of the incident light ① passes through the half transparent layer HT. Almost all of the transmitting light ③ passing through the half transparent layer HT sequentially passes through the buffer layer BUF, the gate insulating layer GI and the passivation layer PAS having the optical transparency of 98% or more. Here, since the absorption rates of the buffer layer BUF, the gate insulating layer GI and the passivation layer PAS are not considered, 100% of the transmitting light ③ may be transmitted.

After that the transmitting light ③ passes through the color filter CF, the anode electrode ANO and the emission layer EL. Finally, the transmitting light ③ is reflected by the cathode electrode CAT. The cathode electrode CAT may have a thickness selected in range of 2,000 Å to 4,000 Å, and all of the transmitting light ③ may be reflected and proceeds toward the substrate 110 as the second reflected light ④.

In this structure, the transparent layer FT is not disposed below the emission area OA. In this case, the absence of the transparent layer FT is the case in which the phases of the first reflected light ② and the second reflected light ④ may be set to be opposite from each other. Further, the amount of the first reflected light ② may be 50% of the incident light ①, and the amount of the second reflected light ④ may also be 50% of the incident light ①. Therefore, in the optical view point of the first reflected light ② and the second reflected light ④, the amplitude is the same, but the phases are opposite, so they may be canceled each other.

Although the amount of transmitting light ③ is significantly reduced by the color filter CF, it does not absolutely affect the degree of total external light reflection. Even in consideration of the light amount of the second reflected light ④ produced by the reflected light ③ of which the amount of light has been reduced by the color filter CF, the luminance of the reflected light from the cathode electrode CAT may be reduced to a level of 10% or less. Since this level is the reflectance of external light in the emission area OA, when the average ratio of the area occupied by the emission area OA to the total area of the substrate 110, 40%, is taken into consideration, the reflectance of external light in the entire substrate 110 may be 5% or less.

Third Embodiment

Figure 10:
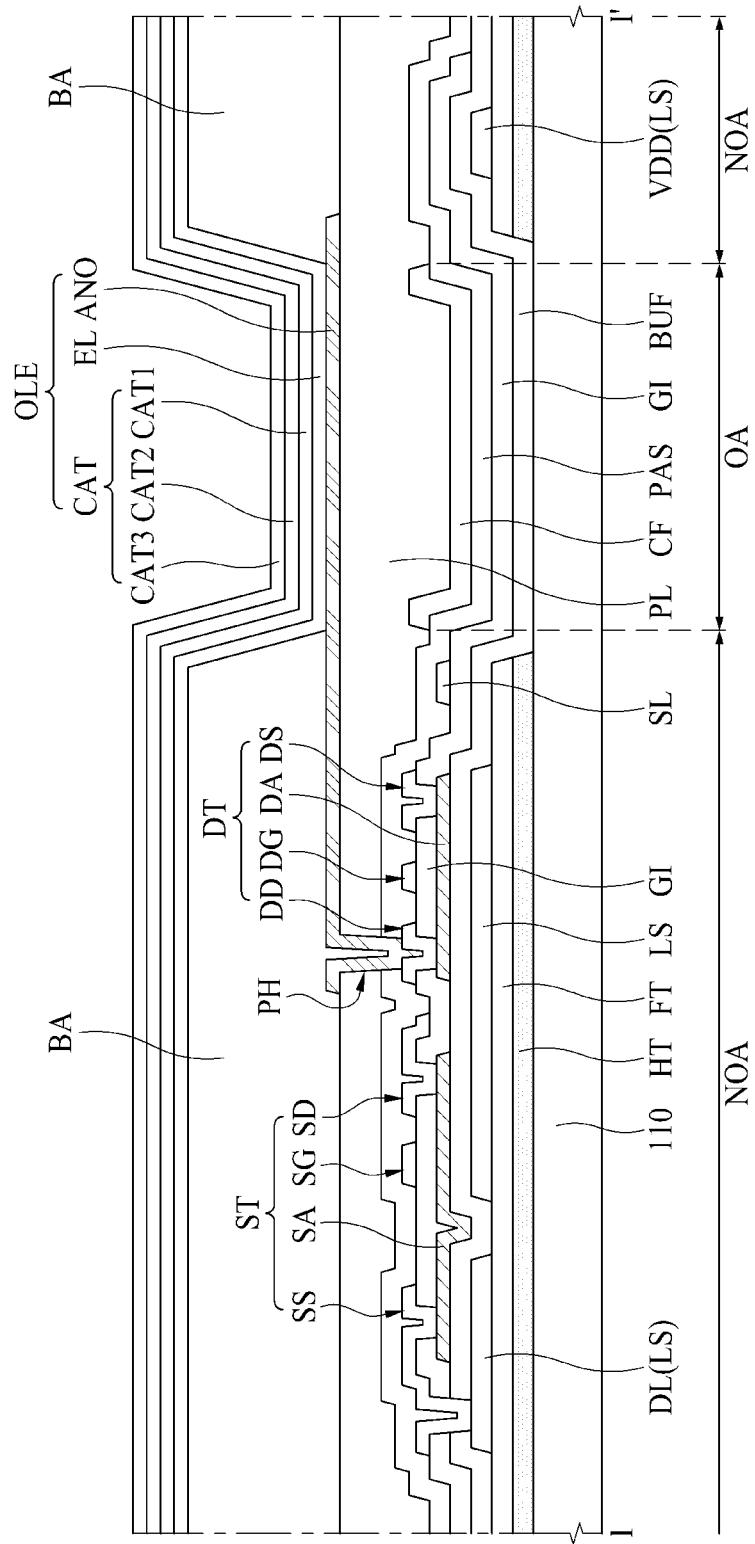
FIG. 10 is a cross-sectional view along cutting line I-I' in FIG. 3 that illustrates the low reflecting structure of the electroluminescence display according to a third embodiment of the present disclosure.
Figure 11:
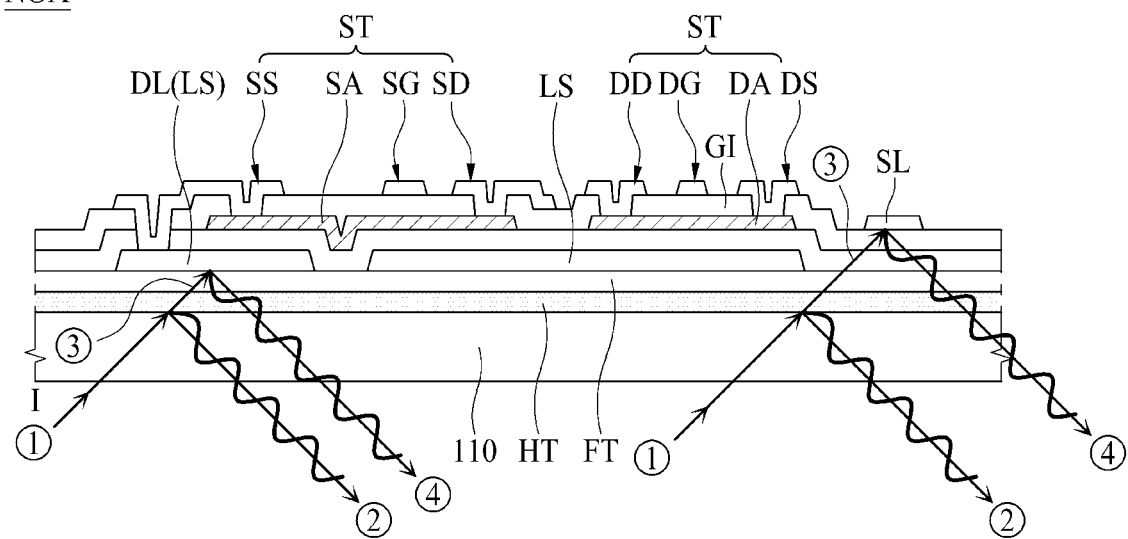
FIG. 11 is an enlarged cross-sectional view illustrating the mechanism for reducing the reflection of external light at the non-emission area in FIG. 10 according to the third embodiment of the present disclosure.
Figure 12:
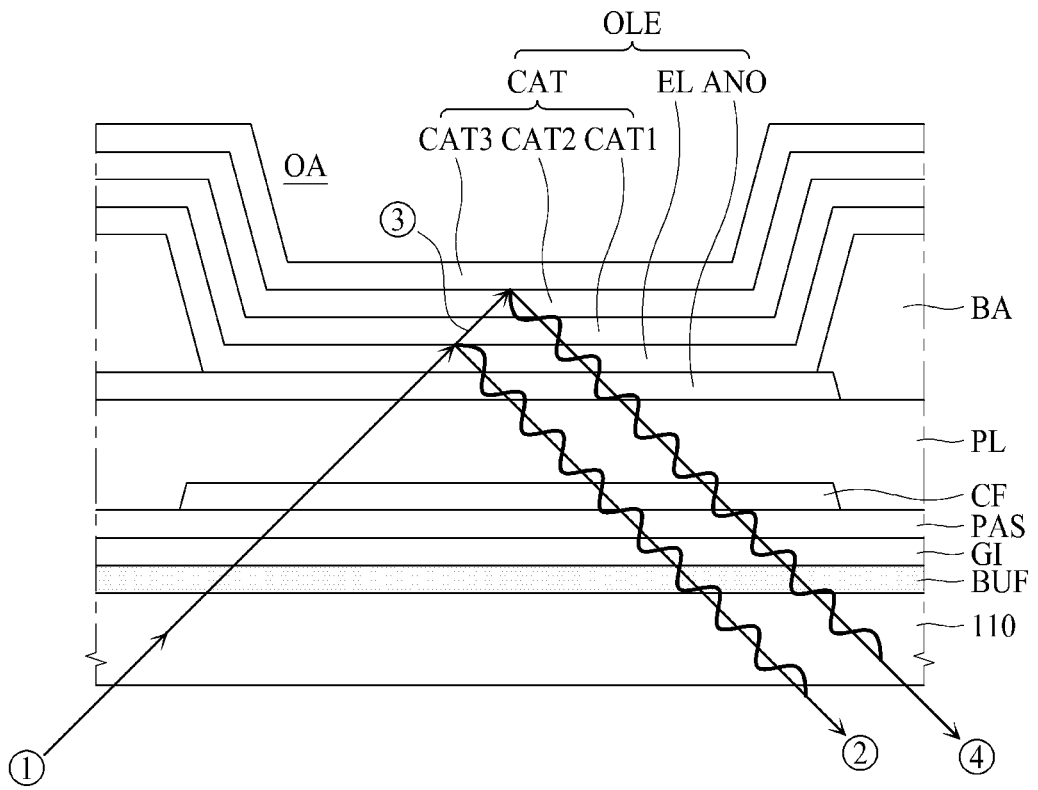
FIG. 12 is an enlarged cross-sectional view illustrating the mechanism for reducing the reflection of external light at the emission area in FIG. 10 according to a third embodiment of the present disclosure.

Hereinafter, referring to FIGS. 10 to 12, the third embodiment of the present disclosure will be described. FIG. 10 is a cross-sectional view along cutting line I-I' in FIG. 3 that illustrates the low reflecting structure of the electroluminescence display according to a third embodiment of the present disclosure. FIG. 11 is an enlarged cross-sectional view illustrating the mechanism for reducing the reflection of external light at the non-emission area in FIG. 10. FIG. 12 is an enlarged cross-sectional view illustrating the mechanism for lowering the reflection of external light at the emission area in FIG. 10.

Referring to FIG. 10, the features of the electroluminescence display according to the third embodiment is very similar with that of the first embodiment. The difference is that, in the first embodiment, the half transparent layer HT and the transparent layer FT are deposited on the entire surface of the substrate 110. In contrast, in the third embodiment, the half transparent layer HT and the transparent layer FT are selectively deposited at an area in the non-emission area NOA that overlaps an area where the light shielding layer LS and the gate line SL are disposed. Therefore, the description for the element of the third embodiment same with the first embodiment may not be duplicated. For the description of the reference numerals in FIG. 10 which is not mentioned in followings, refer to the description of the reference numerals shown in FIG. 4.

Referring to FIG. 11, the external light reflection suppression structure will be mainly described. Firstly, in the structure for suppressing external light reflection in the non-emission area NOA, reflection of external light reflected from the light shielding layer LS and gate line SL may be suppressed by the same manner as the mechanism described with reference to FIG. 5. That is, the first reflected light ② and the second reflected light ④ have the same amplitude and opposite phase, thus they may be canceled by each other. As a result, reflected light luminance, which is the intensity of reflected light incident from the lower outside of the substrate 110 and reflected from the light shielding layer LS and the gate line SL, may be reduced to a level of 2%.

Next, with reference to FIG. 12, a structure for suppressing external light reflection in the emission area OA for the electroluminescence display according to the third embodiment will be described. In the third embodiment, the half transparent layer HT and the transparent layer FT are not deposited on the emission area OA. Therefore, all the external light incident from the lower outside of the substrate 110 is incident to the cathode electrode CAT, as it is. Therefore, in the third embodiment, the cathode electrode CAT has a low reflection structure.

In detail, for a bottom emission type electroluminescence display according to the present disclosure, the cathode electrode CAT may be a multi-layered cathode electrode including three cathode layers. For example, the cathode electrode CAT may include a first cathode layer CAT1, a second cathode layer CAT2, and a third cathode layer CAT3 sequentially stacked on the emission layer EL. The first cathode layer CAT1 may be firstly stacked on the emission layer EL so as to be in direct surface contact with the emission layer EL. The first cathode layer CAT1 may made of a metal material having relatively low surface resistance. For example, the first cathode layer CAT1 may include any one of aluminum (Al), silver (Ag), molybdenum (Mo), gold (Au), magnesium (Mg), calcium (Ca), titanium (Ti), copper (Cu) or barium (Ba). Considering the manufacturing process and cost, a case in which the first cathode layer CAT1 may be formed of aluminum will be explained as the most preferred example.

In the case that the first cathode layer CAT1 is made of aluminum, the first cathode layer CAT1 may be formed a thickness of 100 Å to 200 Å for example. The metallic materials such as aluminum are opaque and relatively highly reflective. However, as aluminum is formed very thin, light may pass through the thin aluminum layer. For example, for thin aluminum layer having a thickness of 200 Å or less, 50% of incident light may be reflected by the aluminum layer, and the remained 50% may transmit the aluminum layer.

The second cathode layer CAT2 may include conductive resin materials. The conductive resin materials may include a domain material made of a resin material with high electron mobility and a dopant for lowering the barrier energy of the domain material. The resin materials having high electron mobility may include any one selected from Alq3, TmPyPB, Bphen, TAZ and TPB. Alq3 may be an abbreviation of 'Tris(8-hydroxyquinoline) Aluminum', and be a complex having a chemical formula of $Al(C_9H_6NO)_3$. TmPyPB may be an organic material that is an abbreviation of '1,3,5-tri(m-pyrid-3-yl-phenyl)benzene'. Bphen may be an organic material that is an abbreviation of 'Bathophenanthroline'. TAZ may be organic material that is an abbreviation of '1,2,3-triazole'. TPB may be organic material that is an abbreviation for triphenyl bismuth. Since these organic materials have high electron mobility, they may be used in a light emitting element.

The dopant materials may include an alkali-based doping material. For example, the dopant materials may include at least any one of lithium (Li), cesium (Cs), cesium oxide ($Cs_2O_3$), cesium nitride ($CsN_3$), rubidium (Rb) and rubidium oxide ($Rb_2O$). For another example, the dopant materials may include fullerene having high electron mobility. Fullerene may be a generic term for molecules in which carbon atoms are arranged in a sphere, ellipsoid or cylinder shape. For example, the dopant materials may include Buckminster-fullerene (C60) in which 60 carbon atoms are mainly bonded in the shape of a soccer ball. In addition, the dopant materials may include higher fullerenes such as C70, C76, C78, C82, C90, C94 and C96.

The second cathode layer CAT2 may have the same materials as the electron transporting layer or electron injecting layer included into the emission layer EL. However, unlike the electron transporting layer or the electron injecting layer, the second cathode layer CAT2 may have higher electron mobility than the electron transporting layer or the electron injecting layer. For example, the electron transporting layer or the electron injecting layer may have the electron mobility of $5.0\times10^{-4}$ (S/m) to $9.0\times10^{-1}$ (S/m), whereas the second cathode layer CAT2 may have an electron mobility of $1.0\times10^{-3}$ (S/m) to $9.0\times10^{+1}$ (S/m). For this, the conductive resin materials included into the second cathode layer CAT2 may have a dopant content higher than that of the electron transporting layer or the electron injecting layer.

For example, the electron transporting layer or the electron injecting layer has a dopant doping concentration of 2% to 10%, whereas the second cathode layer CAT2 may be a conductive resin material having a dopant doping concentration of 10% to 30%. The domain material itself, in which the dopant has a doping concentration of 0%, may have an electrical conductivity of $1.0\times10^{-4}$ (S/m) to $5.0\times10^{-3}$ (S/m). By doping 10% to 30% of dopant into the domain material, the second cathode layer CAT2 may have improved electrical conductivity to $1.0\times10^{-3}$ (S/m) to $9.0\times10^{+1}$ (S/m) to be used as a cathode electrode.

In one case, the second cathode layer CAT2 may have the same conductivity as the electron functional layer (electron transporting layer and/or electron injecting layer) of the emission layer EL. In this case, the sheet resistance of the cathode electrode CAT may be maintained at a sufficiently low value due to the first cathode layer CAT1 made of aluminum.

The third cathode layer CAT3 may be made of the same material as the first cathode layer CAT1. In one embodiment, the third cathode layer CAT3 may have a sufficient thickness so that the sheet resistance of the cathode electrode CAT may be maintained at a constant value regardless of the position of the substrate SUB while not transpassing the light but reflecting all of the light. For example, the third cathode layer CAT3 may be formed of a metal material having a low sheet resistance to have a relatively thicker thickness than the first and second cathode layers CAT1 and CAT2 in order to lower the overall sheet resistance of the cathode electrode CAT. For example, the third cathode layer CAT3 may be formed of aluminum having a thickness in range of 2,000 Å to 4,000 Å.

The cathode electrode CAT having such a thickness and a stacked structure mentioned above may reduce reflection ratio with respect to the light incident from the bottom direction of the substrate (i.e., from the outside to the first cathode layer CAT1). A portion requiring external light reflection suppression may be a display area that may mainly affect image information. Accordingly, a low reflection structure is implemented in the cathode electrode CAT that is commonly applied over the entire display area AA. Hereinafter, description will be made with reference to arrows indicating the optical path shown in FIG. 12.

Referring to the structure of the cathode electrode CAT included into light emitting diode OLE, the incident light ① from the lower outside of the cathode electrode CAT may pass through the anode electrode ANO and the emission layer EL which are transparent. Some of the incident light ① may be reflected at the bottom (or lower) surface of the first cathode layer CAT1 and then proceed toward the substrate 110 as the first reflected light ②. Since the first cathode layer CAT1 has a thin thickness of 200 Å or less, all of the incident light 1 may not be reflected. For example, 50% of the incident light ① may be reflected as the first reflected light ②, and the remaining 50% of the incident light ① may pass through the first cathode layer CAT1. The whole amount of the transmitted light ③ passing through the first cathode layer CAT1 may pass through the transparent second cathode layer CAT2. After that, the transmitted light ③ may be reflected by the third cathode layer CAT3. Since the third cathode layer CAT3 may have a thickness of 2,000 Å to 4,000 Å, whole amount of the transmitted light ③ may be reflected and proceed toward the substrate 110 as the second reflected light ④.

Here, by adjusting or changing the thickness of the second cathode layer CAT2, the phases of the first reflected light ② and the second reflected light ④ may be set to cancel each other. Accordingly, the reflected light luminance, which is the intensity of the reflected light incident from outside of the cathode electrode CAT and finally reflected to the outside of the substrate 110 may be reduced to 2% or less.

Meanwhile, among the lights emitted from the emission layer EL, the amount of light emitted to the direction of the cathode electrode CAT and reflected by the cathode electrode CAT may be reduced by about 2% through the same mechanism. However, since the light emitted from the emission layer EL may be propagated in all directions, the amount of light reduced by the cathode electrode CAT may be only about 50% of the total amount of the light from the emission layer EL, and the remaining 50% may be emitted toward the substrate 110.

Fourth Embodiment

Figure 13:
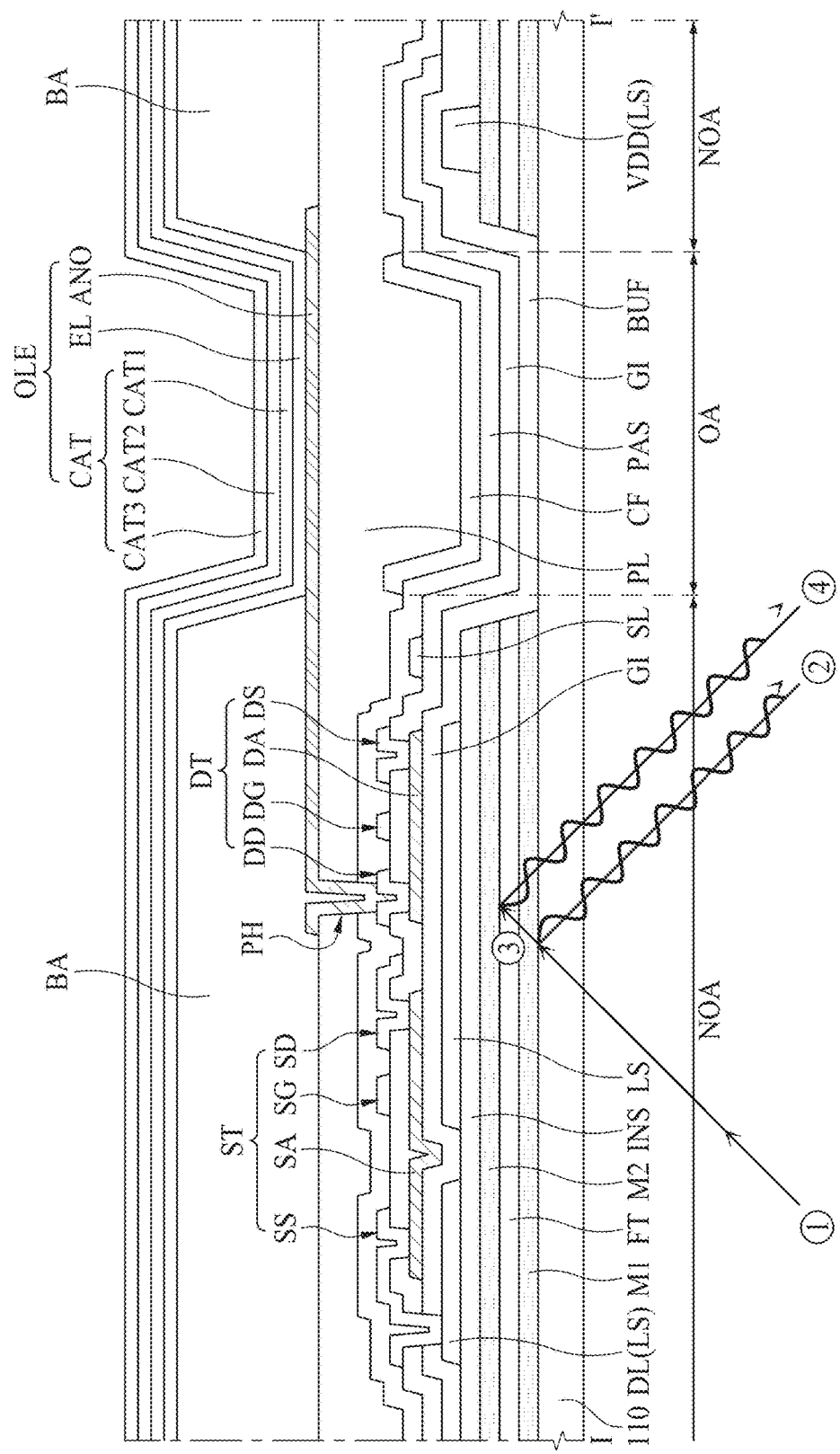
FIG. 13 is an enlarged cross-sectional view illustrating the low reflecting structure of the electroluminescence display according to a fourth embodiment of the present disclosure.

Hereinafter, referring to FIG. 13, the fourth embodiment of the present disclosure will be described. FIG. 13 is an enlarged cross-sectional view illustrating the low reflecting structure of the electroluminescence display according to a fourth embodiment of the present disclosure. The fourth embodiment may have the same structure as the third embodiment in the emission area, and have a different structure from the third embodiment in the non-emission area.

Referring to FIG. 13, at the non-emission area NOA on the substrate 110, a first metal layer M1, a transparent layer FT, a second metal layer M2, and an insulating layer INS are sequentially stacked. This four-layered structure is not disposed at the emission area OA. A buffer layer BUF is deposited on entire surface of the substrate 110 having the four-layered structure partially.

The first metal layer M1 is formed of a metal material having a thickness of 100 Å to 200 Å. The first metal layer M1 includes any one metal material selected from aluminum (Al), silver (Ag), molybdenum (Mo), gold (Au), magnesium (Mg), calcium (Ca), titanium (Ti), copper (Cu) and barium (Ba). The transparent layer FT includes an inorganic material having optical transparency of 98% or more. The second metal layer M2 is formed of an opaque metal material having a thickness of 2,000 Å to 4,000 Å. The insulating layer INS includes an inorganic insulating material for electrically insulating from the metal material formed on the second metal layer M2.

A light shielding layer LS is disposed at the non-emission area NOA on the insulating layer INS. On the light shielding layer LS, a buffer layer BUF is deposited at the non-emission area NOA and the emission area OA. On the buffer layer BUF, the gate line SL, the switching thin film transistor ST and the driving thin film transistor DT are formed. A planarization layer PL is deposited on the entire surface of the substrate 110 having the thin film transistors ST and DT. The planarization layer PL is deposited on the emission area OA also.

On the planarization layer PL, an anode electrode ANO is formed at the emission area OA. An emission layer EL and a cathode electrode CAT are sequentially deposited on the anode electrode ANO. The emission layer EL and the cathode electrode CAT are also deposited on the non-emission area NOA. The cathode electrode CAT includes a first cathode layer CAT1, a second cathode layer CAT2 and a third cathode layer CAT3 sequentially stacked.

In such a structure, an external light reflection suppression structure in the non-emission area NOA is as follows. When the first metal layer M1 is made of aluminum, the first metal layer M1 has a thickness of 100 Å to 200 Å in one embodiment. Metallic materials such as aluminum are opaque and highly reflective. However, when aluminum is formed very thinly, light may be transmitted. For example, with a thin thickness of 100 Å to 200 Å, 50% of incident light may be reflected and the remaining 50% may be transmitted. Here, the first metal layer M1 may be the same element as the half transparent layer HT described above.

Incident light ① entering from the lower outside of the substrate 110 is transmitted through the substrate 110. 50% of the incident light ① is reflected from the lower surface of the first metal layer M1 to the substrate 110 as a first reflected light ②. Meanwhile, remaining 50% of the incident light ① passes through the first metal layer M1. Almost all of the transmitting light ③ passing through the first metal layer M1 sequentially passes through the transparent layer FT having the optical transparency of 98% or more. Here, since the absorption rates of the transparent layer FT are not considered, 100% of the transmitting light ③ may be transmitted. After that, the transmitting light ③ is reflected by the second metal layer M2. The second metal layer M2 may have a thickness selected in range of 2,000 Å to 4,000 Å, and all of the transmitting light ③ may be reflected and proceeds toward the substrate 110 as the second reflected light ④

By adjusting or controlling the thickness of the transparent layer FT, the phases of the first reflected light ② and the second reflected light ④ may be set to cancel each other. The amount of the first reflected light ② may be 50% of the incident light ①, and the amount of the second reflected light ④ may also be 50% of the incident light ①. Therefore, in the optical view point of the first reflected light ② and the second reflected light ④, the amplitude is the same, but the phases are opposite, so they may be canceled each other. As a result, reflected light luminance, which is the intensity of reflected light incident from the lower outside of the substrate 110 and reflected from the light shielding layer LS, may be reduced to a level of 2%.

As described above, the electroluminescence display according to various embodiments of the present disclosure may be a bottom emission type having an external light reflection suppression structure. Accordingly, there is no need to dispose a polarizing element to reduce external light reflection outside the substrate 110. The polarizing element has a positive effect of suppressing external light reflection, but has a negative effect of reducing the amount of light emitted from the emission layer EL by at least 50%.

In the electroluminescence display according to the present disclosure, the amount of light provided from the emission layer EL may be reduced by about 50% due to the external light reflection suppression structure, but this is almost the same as the reduction in the amount of light by the polarizer. Accordingly, the electroluminescence display according to the present disclosure may minimize external light reflection while providing the same level of luminous efficiency of the emission layer EL without using an expensive polarizing element.

In one example, a display device includes a substrate including an emission area and a non-emission area, a transistor in the non-emission area, a light emitting element in the emission area, a first transparent layer on the substrate, a second transparent layer on the first transparent layer. The light emitting element is electrically connected to the transistor. The first transparent layer has a first optical transmittance. The transparent layer having a second optical transmittance that is different from the first optical transmittance of the first transparent layer. A thickness of the second transparent layer is proportional to a half wavelength of a predetermined color of light.

In one example, the predetermined color of light is green light.

In one example, the first transparent layer and the second transparent layer are between the substrate and the transistor in the non-emission area. The display device further includes a signal line between the transistor and the second transparent layer.

In one example, a first phase of a first reflected light from the first transparent layer and a second phase of a second reflected light from the signal line are opposite in phase from each other.

In one example, the first transparent layer and the second transparent layer are on the emission area and the non-emission area of the substrate.

In one example, the first transparent layer is on the emission area and the non-emission area of the substrate, and the second transparent layer is on the non-emission area but not the emission area of the substrate.

In one example, the first transparent layer and the second transparent layer are on the non-emission area of the substrate but not the emission area of the substrate.

In one example, a display device includes a substrate including an emission area and a non-emission area, a transistor in the non-emission area, a light emitting element in the emission area, a metal layer that at least partially overlaps the transistor in the non-emission area, a plurality of transparent layers including a first transparent layer and a second transparent layer that is more transparent than the first transparent layer. The light emitting element is electrically connected to the transistor. The plurality of transparent layers overlapping the transistor and are between the metal layer and the substrate in the non-emission area. The first transparent layer is configured to reflect a portion of incident light having a first phase and transmit a portion of the incident light toward the transistor, and the second transparent layer is configured to transmit the portion of the incident light from the first transparent layer toward the transistor such that the portion of incident light is reflected by the metal layer and has a second phase that is opposite in phase to the first phase.

In one example, the first transparent layer includes a metal material having a thickness in a range of 100 Å to 200 Å, and the second transparent layer includes an inorganic material having a thickness in a range of 200 Å to 1,500 Å.

In one example, the light emitting element includes a first electrode, an emission layer on the first electrode, and a multi-layered second electrode on the emission layer.

In one example, the multi-layered second electrode comprises a first cathode layer including a first metal material with a thickness in a range of 100 Å to 200 Å, a second cathode layer including a conductive resin material having a domain material and a dopant, and a third cathode layer including a second metal material with a thickness in a range of 2,000 Å to 4,000 Å.

In one example, the first transparent layer and the second transparent layer are on the emission area and the non-emission area of the substrate, or the first transparent layer is on the emission area and the non-emission area of the substrate, and the second transparent layer is on the non-emission area but not the emission area of the substrate, or the first transparent layer and the second transparent layer are on the non-emission area of the substrate but not the emission area of the substrate.

The features, structures, effects and so on described in the above example embodiments of the present disclosure are included in at least one example embodiment of the present disclosure, and are not necessarily limited to only one example embodiment. Furthermore, the features, structures, effects and the like explained in at least one example embodiment may be implemented in combination or modification with respect to other example embodiments by those skilled in the art to which this disclosure is directed. Accordingly, such combinations and variations should be construed as being included in the scope of the present disclosure.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents. These and other changes can be made to the embodiments in light of the above detailed description. In general, in the following claims, the terms used should not be construed to limit the claims to the specific example embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display comprising:
   a substrate including an emission area and a non-emission area;
   a partially transparent layer on the substrate, the partially transparent layer having a first optical transmittance;
   a transparent layer on the partially transparent layer, the transparent layer having a second optical transmittance that is greater than the first optical transmittance of the partially transparent layer;
   a signal line on the transparent layer in the non-emission area;
   a passivation layer covering the signal line;
   a planarization layer on the passivation layer; and
   a light emitting element on the planarization layer in the emission area, the light emitting element including a first electrode, an emission layer on the first electrode, and a second electrode on the emission layer,
   wherein the transparent layer has a thickness in which a first phase of a first reflected light from the partially transparent layer and a second phase of a second reflected light from the signal line are opposite in phase from each other, and
   wherein the first phase of a first reflected light from the partially transparent layer and a third phase of a third reflected light from the second electrode are opposite in phase from each other.

2. The electroluminescence display according to claim 1, wherein the second electrode includes:
   a first cathode layer on the emission layer;
   a second cathode layer on the first cathode layer; and
   a third cathode layer on the second cathode layer.

3. The electroluminescence display according to claim 2, wherein the first cathode layer includes a first metal material with a thickness in a range of 100 Å to 200 Å, the second cathode layer includes a conductive resin material having a domain material and a dopant, and the third cathode layer includes a second metal material with a thickness in a range of 2,000 Å to 4,000 Å.

4. The electroluminescence display according to claim 1, wherein the partially transparent layer includes a metal material having a thickness in a range of 100 Å to 200 Å, and the transparent layer includes an inorganic material having a thickness in a range of 200 Å to 1,500 Å.

5. The electroluminescence display according to claim 1, wherein the partially transparent layer and the transparent layer are on the emission area and the non-emission area of the substrate.

6. The electroluminescence display according to claim 1, wherein the partially transparent layer is on the emission area and the non-emission area of the substrate, and the transparent layer is on the non-emission area but not the emission area of the substrate.

7. The electroluminescence display according to claim 1, wherein the partially transparent layer and the transparent layer are on the non-emission area of the substrate but not the emission area of the substrate.

8. The electroluminescence display according to claim 7, further comprising:
   an opaque reflective layer on the transparent layer in the non-emission area of the substrate but not the emission area; and
   an insulating layer on the opaque reflective layer in the non-emission area of the substrate but not the emission area.

9. The electroluminescence display according to claim 8, wherein the transparent layer has a thickness in which the first phase of the light reflected from the partially transparent layer and a fourth phase of a light reflected from the opaque reflective layer are opposite in phase from each other.

10. The electroluminescence display according to claim 9, wherein the second electrode comprises:
    a first cathode layer on the emission layer, the first cathode layer including a first metal material having a thickness of 100 Å to 200 Å;
    a second cathode layer on the first cathode layer, the second cathode layer including a conductive organic material having a domain material and a dopant; and
    a third cathode layer on the second cathode layer, the third cathode layer including a second metal material having a thickness of 2,000 Å to 4,000 Å.

11. The electroluminescence display according to claim 10, wherein the second cathode layer has a thickness in which a phase of a light reflected from the first cathode layer and phase of a light reflected from the third cathode layer are opposite in phase from each other.

12. The electroluminescence display according to claim 1, wherein the partially transparent layer includes one of aluminum (Al), silver (Ag), molybdenum (Mo), gold (Au), magnesium (Mg), calcium (Ca), titanium (Ti), copper (Cu), or barium (Ba).

13. The electroluminescence display according to claim 1, wherein the signal line includes:
    a light shielding layer on the transparent layer;
    a buffer layer on the light shielding layer; and
    a gate line at the non-emission area, the gate line non-overlapping with the light shielding layer.

14. The electroluminescence display according to claim 1, wherein the first optical transmittance is in a range of 40% to 50%, and the second optical transmittance is greater than or equal to 98%.

15. The electroluminescence display according to claim 1, wherein a distance between a bottom surface of the partially transparent layer and a bottom surface of the signal line is proportional to a half wavelength of a predetermined color of light.

16. The electroluminescence display according to claim 1, wherein a distance between a bottom surface of the partially transparent layer and a bottom surface of the second electrode is proportional to a half wavelength of a predetermined color of light.

* * * * *